United States Patent
Miller et al.

(10) Patent No.: US 12,131,279 B1
(45) Date of Patent: Oct. 29, 2024

(54) SYSTEM AND METHOD FOR UNEXPECTED EVENT PREPARATION

(71) Applicant: Priority 5 Holdings, Inc., Needham, MA (US)

(72) Inventors: Charles Q. Miller, Boston, MA (US); Anthony J. McDermott, Dracut, MA (US); Allen D. Bierbaum, Ames, IA (US)

(73) Assignee: Priority 5 Holdings, Inc., Needham, MA (US)

( * ) Notice: Subject to any disclaimer, the term of this patent is extended or adjusted under 35 U.S.C. 154(b) by 1305 days.

(21) Appl. No.: 16/163,938

(22) Filed: Oct. 18, 2018

Related U.S. Application Data

(62) Division of application No. 12/208,738, filed on Sep. 11, 2008, now abandoned.

(60) Provisional application No. 60/972,348, filed on Sep. 14, 2007.

(51) Int. Cl.

| | |
|---|---|
| *G06Q 10/0635* | (2023.01) |
| *G06F 16/904* | (2019.01) |
| *G06F 16/907* | (2019.01) |
| *G06F 30/20* | (2020.01) |
| *G06Q 10/0631* | (2023.01) |
| *G06Q 10/0639* | (2023.01) |
| *G06Q 50/26* | (2012.01) |

(52) U.S. Cl.
CPC ....... *G06Q 10/0635* (2013.01); *G06F 16/904* (2019.01); *G06F 16/907* (2019.01); *G06F 30/20* (2020.01); *G06Q 10/063118* (2013.01); *G06Q 10/06395* (2013.01); *G06Q 50/26* (2013.01)

(58) Field of Classification Search
CPC .... G06F 21/552; G06F 21/554; G06F 21/577; G06Q 90/00; G06Q 10/06; G06Q 10/10; G06Q 10/0635; G06Q 10/0637; G06Q 10/063; G06Q 50/26
See application file for complete search history.

(56) References Cited

U.S. PATENT DOCUMENTS

| | | | |
|---|---|---|---|
| 6,105,046 | A | 8/2000 | Greenfield et al. |
| 6,906,709 | B1 | 6/2005 | Larkin et al. |
| 7,194,395 | B2 | 3/2007 | Genovese |
| 2002/0120714 | A1 | 8/2002 | Agapiev |
| 2003/0187967 | A1 | 10/2003 | Walsh et al. |
| 2004/0008125 | A1 | 1/2004 | Aratow et al. |
| 2004/0243595 | A1 | 12/2004 | Cui et al. |
| 2005/0001720 | A1 | 1/2005 | Mason et al. |
| 2005/0004823 | A1* | 1/2005 | Hnatio ................ G06Q 10/10 706/62 |
| 2005/0034075 | A1 | 2/2005 | Riegelman et al. |
| 2005/0086227 | A1 | 4/2005 | Sullivan |
| 2005/0234696 | A1 | 10/2005 | North et al. |
| 2006/0010108 | A1 | 1/2006 | Greenberg |

(Continued)

OTHER PUBLICATIONS

Lee, Earl Eugene,, II. "Assessing Vulnerability and Managing Disruptions to Interdependent Infrastructure Systems: A Network Flows Approach." 3232614 Rensselaer Polytechnic Institute, 2006. Ann Arbor: ProQuest. Web. Jun. 18, 2024 (Year: 2006).*

(Continued)

*Primary Examiner* — Michael P Harrington
(74) *Attorney, Agent, or Firm* — CMLaw; Orlando Lopez

(57) ABSTRACT

A system and method to provide simulation augmented effects based event planning and management.

5 Claims, 7 Drawing Sheets

(56) References Cited

U.S. PATENT DOCUMENTS

| | | |
|---|---|---|
| 2006/0136860 A1 | 6/2006 | Boshart et al. |
| 2006/0167728 A1* | 7/2006 | Siegel .................. G06Q 40/08 |
| | | 705/7.28 |
| 2006/0168185 A1 | 7/2006 | McCall et al. |
| 2006/0235833 A1 | 10/2006 | Smith et al. |
| 2007/0021955 A1 | 1/2007 | Tolone et al. |
| 2007/0297589 A1 | 12/2007 | Greischar et al. |
| 2007/0299746 A1 | 12/2007 | Haley et al. |
| 2008/0040174 A1 | 2/2008 | Murthy et al. |
| 2008/0052054 A1 | 2/2008 | Beverina |
| 2008/0114878 A1 | 5/2008 | Gopalkrishnan et al. |
| 2008/0172262 A1 | 7/2008 | An |
| 2008/0178178 A1 | 7/2008 | Kumar et al. |

OTHER PUBLICATIONS

Certificate of Safety Act Designation for Touch Assisted Command & Control System (TACCS(TM)). U.S. Department of Homeland Security, Dec. 18, 2015.

AAPA Information Technology Awards, available at www.aapaports.org.

Greater Lafourche Port Commission, Maritime Domain Awareness System GLPC-C4 (Command, Control, Communications, Collaboration), submitted Jun. 4, 2013.

Presidential Policy Directive/PPD-8: National Preparedness. Official website of the Department of Homeland Security. Downloaded from http://www.dhs.gov/presidential-policy-directive-8-national-preparedness on Nov. 18, 2015.

12 Steps to Developing an Effective Emergency Management Plan. Manual from Fire and Emergency Services—Newfoundland and Labrador (FES-NL). Available at www.gov.nl.ca/fes, last updated Apr. 7, 2015.

NERCPI Regional Cyber Disruption Planning manual. Presentation by New England Regional Catastrophic Preparedness Initiative, available at www.newenglandrcpi.org, (c) 2015.

Exercises. Downloaded from http://www.ready.gov/business/testing/exercises on Nov. 17, 2015.

National Preparedness System. Manual of U.S. Department of Homeland Security, Nov. 2011.

Comprehensive Preparedness Guide (CPC) 101: Developing and Maintaining Emergency Operations Plans, Version 2.0. Manual of U.S. Department of Homeland Security, Federal Emergency Management Agency (FEMA), Nov. 2010.

Unit 2: Comprehensive Exercise Program. Manual of Federal Emergency Management Agency (FEMA), Emergency Management Institute (EMI). Available at www.training.fema.gov/emiweb, last modified Nov. 20, 2015.

Unit 5: The Tabletop Exercise. Manual of Federal Emergency Management Agency (FEMA), Emergency Management Institute (EMI). Available at www.training.fema.gov/emiweb, last modified Nov. 20, 2015.

Unit 7: The Full-Scale Exercise. Manual of Federal Emergency Management Agency (FEMA), Emergency Management Institute (EMI). Available at www.training.fema.gov/emiweb, last modified Nov. 20, 2015.

Anderson, C. What's the Difference Between Policies and Procedures? Bizmanuals(R). Downloaded from www.bizmanualz.com on Nov. 17, 2015.

CHCCS301A: Defining Policy and procedures. Queensland Council of Social Service (QCOSS) Community Door eTraining. Downloaded from www.etraining.communitydoor.org.au on Nov. 17, 2015.

What are policies and procedures? definition and meaning. BusinessDictionary.com. Downloaded from www. businessdictionary.com on Nov. 17, 2015.

Certificate of Safety Act Designation for Touch Assisted Command & Control System (TACCS(TM)). U.S. Department of Homeland Security, May 4, 2011.

What is node?—Definition from Whatis.com. Downloaded from http://searchnetworking.techtarget.com/definition/node on Nov. 17, 2015.

Node Definition. Downloaded from http://techterms.com/definition/node on Nov. 17, 2015.

What is virtual server?—Definition from WhatIs.com. Downloaded from http://searchnetworking.techtarget.com/definition/virtual-server on Nov. 17, 2015.

What is a Virtual Server?—Definition from Techopedia. Downloaded from www.techopedia.com on Nov. 17, 2015.

Tanenbaum, A.S. Computer Networks. Englewood Cliffs, NJ: Prentice Hall, Inc. (1981), p. 7.

Patterson, D.A et al. Computer Organization and Design: the Hardware/Software Interface (4th Ed.) New York: Elsevier (2012), pp. 17-19.

What is Virtual Server? Webopedia. Downloaded from www.webopedia.com on Nov. 18, 2015.

Definition of: server virtualization. PC Magazine Encyclopedia. Downloaded from www.pcmag.com on Nov. 17, 2015.

Brailsford, S et al. (Eds.) Discrete-Event Simulation and System Dynamics for Management Decision Making. John Wiley & Sons, Ltd. (2014), pp. 12-13, 20-21, 202-203.

* cited by examiner

SYSTEM AND METHOD FOR UNEXPECTED EVENT PREPARATION

CROSS REFERENCE TO RELATED APPLICATIONS

This application is a divisional application of U.S. patent application Ser. No. 12/208,738, entitled SYSTEM AND METHOD FOR UNEXPECTED EVENT PREPARATION, filed on Sep. 11, 2008, which claims priority under 35 U.S.C. § 119 from U.S. Provisional Patent Application Ser. No. 60/972,348 entitled SYSTEM AND METHOD FOR UNEXPECTED EVENT PREPARATION, filed on Sep. 14, 2007, all of which are incorporated by reference herein in their entirety.

BACKGROUND

The system and method of the present embodiment relate generally to preparation for and management of unexpected, and perhaps deleterious, events. Specifically, the embodiment provides simulation augmented effects based event planning and management, and comprises a system and method to provide automated assistance to disaster management personnel with disparate cultural backgrounds and computer skill levels.

SUMMARY

The needs set forth above as well as further and other needs and advantages are addressed by the present embodiment. Solutions and advantages are achieved by the illustrative embodiment described herein below.

The method of the present embodiment for creating and testing procedures and policies and/or training personnel to respond to an event can include, but is not limited to including, the steps of (a) determining location information associated with the event, (b) creating a base canvas using at least one data feed and the location information. The data feed can receive, for example, but not limited to, data that includes environmental parameters that affect asset conditions, for example, weather-related data. The base canvas can include imagery or map, chart, or diagrammatic representation based upon the location information. At least one data layer can be overlain upon the base canvas and is correlated and geospatially aligned with the imagery according to the location information. The method can also include the steps of (c) identifying assets associated with the location information, each of the assets being characterized by asset vulnerabilities, asset dependencies, asset behavior, asset type, and asset condition, (d) associating the assets with at least one data layer, (e) aggregating data associated with the assets from the data feeds while the user is interfacing with the data layers, (f) identifying dependencies, vulnerabilities, and behaviors associated with the assets, (g) selecting the assets associated with the event, (h) changing the asset condition based on the asset dependencies, the asset vulnerabilities, and the asset behaviors, (i) simulating the event based on the selected assets, the location information, the asset condition, the base canvas, at least one data layer, and the asset vulnerabilities, dependencies, and behaviors, (j) continuously updating the asset condition based on the asset vulnerabilities, the asset dependencies, and the asset behaviors, (k) continuously updating the data layers with information from the data feeds, (l) sending, to the user, results of the step of simulating, (m) changing the policies/procedures based on a cost/benefit analysis of the updated asset conditions, and (n) repeating steps (h)-(m) until the policies and procedures are created and tested and/or the training is complete.

The system of the present embodiment for training personnel to respond to an event, or for responding to an actual event can include, but is not limited to including, an information collector determining location information and assets associated with the event, and a base canvas processor creating a base canvas using at least one data feed, the location information, and information associated with the assets. In the case of an actual event, the base canvas processor continuously updates data and asset conditions based on actual field data. The system can further include an asset data processor that can update asset condition based on asset dependencies, asset vulnerabilities, asset behaviors, and, possibly, asset interdependencies. The system can also include an interdependency network used by a simulator to simulate the event based on selected of the assets, location information, asset condition, base canvas, at least one data layer, asset vulnerabilities, asset dependencies, and asset behaviors. Based on asset condition at any time, the system can allow the user to project future asset performance by simulating additional events based on the selected assets, the location information, the asset condition, the base canvas, at least one data layer, the asset vulnerabilities, dependencies, and behaviors. The simulator can update asset condition based on the simulation, and can send results of the simulation to the user interface. The user may toggle back and forth between actual and simulated conditions. Finally, multiple units can be networked to share data and create a common operating picture.

For a better understanding of the present embodiment, together with other and further objects thereof, reference is made to the accompanying drawings and detailed description.

DETAILED DESCRIPTION

The present embodiment is described more fully hereinafter with reference to the accompanying drawings, in which the present embodiment is shown. The following configuration description is presented for illustrative purposes only. Any computer configuration and architecture satisfying the speed and interface requirements herein described may be suitable for implementing the system and method of the present embodiment.

Figure 1:
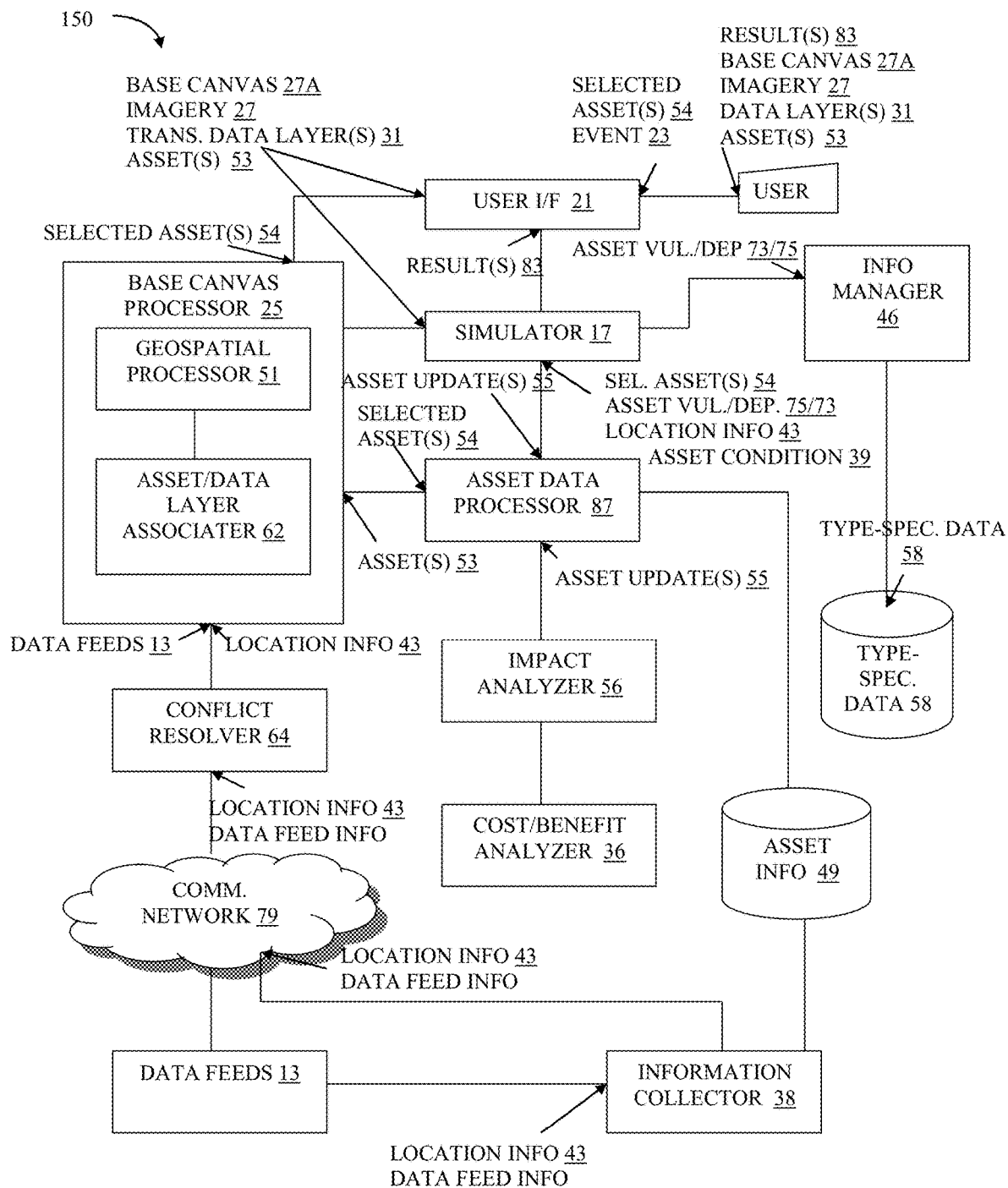
FIG. 1 is a schematic block diagram of the components of the event system of the present embodiment.

Referring now to FIG. 1, system 150 for training personnel to respond to event 23, or for creating and testing policies and procedures to respond to event 23, or for responding to event 23 can include, but is not limited to including, information collector 38 determining location information 43 and assets 53 associated with event 23, base canvas processor 25 creating base canvas 27A using at least one data feed 13, location information 43, and information associated with assets 53. Base canvas 27A can have imagery 27 and at least one data layer 31 that is overlain upon base canvas 27A. Base canvas processor 25 can continuously update at least one data layer 31 with information from at least one data feed 13. System 150 can further include geospatial processor 51 correlating and geospatially aligning at least one data layer 31 with imagery 27 and base canvas 27A according to location information 43. System 150 can also include asset/data layer associater 62 identifying assets 53 associated with location information 43 and associating assets 53 with at least one data layer 31, user interface 21 receiving selected assets 54 from assets 53 from a user who is interfacing with at least one data layer 31 provided by base canvas processor 25 while base canvas processor 25 aggregates data from at least one data feed 13 associated with assets 53, and asset data processor 87 identifying asset dependencies 73 and asset vulnerabilities 75 associated with selected assets 54. System 150 can still further include an interdependency network used by simulator 17 which simulates event 23 based on selected assets 54, location information 43, asset condition 39, base canvas 27A, at least one data layer 31, asset vulnerabilities 75, asset dependencies 73, and asset behaviors. Simulator 17 can update asset conditions 39 based on the simulation, and simulator 17 can send results 83 of the simulation to user interface 21. Simulator 17 can continue the simulation until the training is complete, or until the policies and procedures are created or tested, or until the event has concluded.

Figure 2:
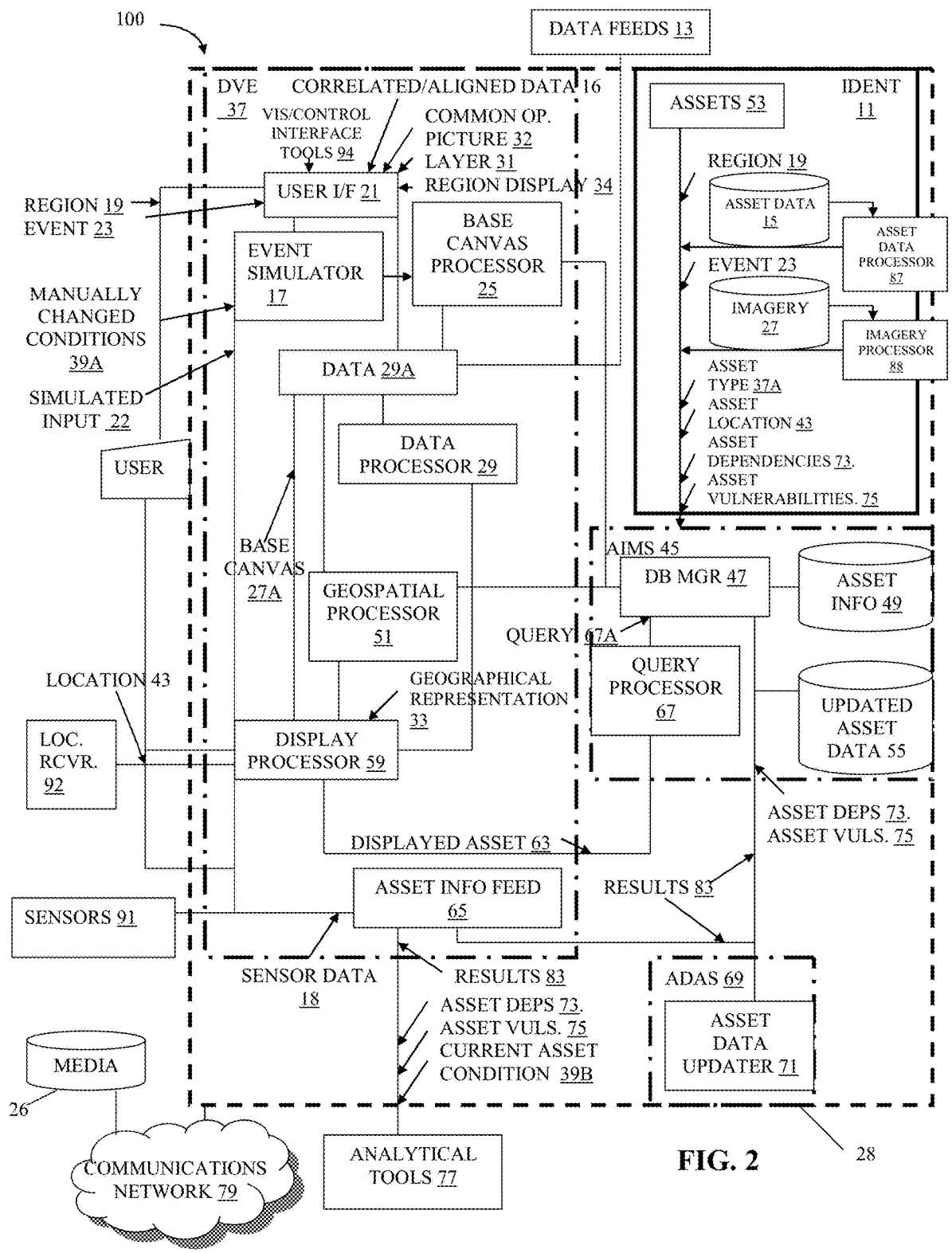
FIG. 2 is a schematic block diagram of an exemplary embodiment of the event system.

Continuing to refer primarily to FIG. 1, system 150 can optionally include information manager 46 grouping assets 53 according to an asset type 37A, automatically deriving dependency, vulnerability, and behavior information from assets 53 based on asset type 37A (FIG. 2), and storing dependency, vulnerability, and behavior information as asset-specific or type-specific data 58 on computer-readable medium 26 (FIG. 2). System 150 can further optionally include conflict resolver 64 identifying and resolving conflicts among information received from a plurality of data feeds 13, each containing analysis information. Base canvas processor 25 can superimpose the resolved data feeds on at least one data layer 31. System 150 can also optionally include impact analyzer 56 anticipating at least one impact based on asset condition 39, asset dependencies 73, asset vulnerabilities 75, and asset behaviors, updating asset conditions 39 according to an effect of at least one impact on selected assets 54, and providing a notification to the user by flagging assets 53 with changed data or changed asset conditions. Simulator 17 can simulate event 23 based on selected assets 54, location information 43, asset condition 39, and updated assets 55, and can update updated assets 55 and asset condition 39 based on the simulation. System 150 can optionally include cost/benefit analyzer 36 choosing a change to selected assets 54 based on a cost/benefit analysis of updated assets 55.

Referring now to FIG. 2, system 100 can create common operating picture 32 that can be understood by culturally disparate public and private agencies and organizations to train decision makers by allowing them to view results of their actions in a simulated environment, and to manage unexpected events in a command and control environment. System 100 can provide the ability to display asset location information 43, aggregate asset data 15 obtained from multiple sources and display/visualize these aggregated data, identify asset dependencies 73 and vulnerabilities 75, and utilize analytical tools 77 to perform disruption impact analyses. System 100 can be used to develop and test policies and procedures to respond to unexpected events 23 such as, for example, terrorist events and natural disasters, and can train decision makers by allowing them (1) to view results 83 of their actions in a simulated environment, and (2) to manage unexpected events 23 in a command and control environment.

Continuing to refer to FIG. 2, system 100 can include, but is not limited to including, identification process 11 configured to identify, classify or typify, locate, and understand what is Critical Infrastructure/Key Resources (CI/KR) known herein also as key assets and what is not. Identification process 11 can include, but is not limited to determining the vulnerabilities and dependencies of selected CI/KR assets, and selecting the best source of imagery to utilize as a base canvas for visualizing event scenarios. Identification process 11 can include imagery processor 88 which can optimally incorporate images ranging from simple charts or diagrams to complex images from sources such as, for example, Geographic Information System (GIS) databases, data management tools, for example, ESRI® ARCGIS®, streaming feeds, for example, DIGITAL-GLOBE™, and other complex data sources, and can provide structure to the complexity of CI/KR and its classification or organization into asset types 37A. System 100 can also include automated data aggregation system (ADAS) 69 configured to determine who owns a critical infrastructure or asset 53 and how to contact the owner of asset 53. ADAS 69 can also be configured to collect geospatial, public, internet, internal, private, and official raw data.

Continuing to still further refer to FIG. 2, system 100 incorporates analytical tools 77 including the, which can be configured to identify the effects that result from interdependencies between infrastructure components. Interdependencies can include physical/direct linkages, indirect (geospatial) linkages, policy/procedural dependencies, informational dependencies, societal dependencies, and supply chain dependencies.

Continuing to still further refer to FIG. 2, system 100 can also include data visualization engine (DVE) 37 configured to integrate received data into one visual network and serve as common operating picture 32 for command and control. DVE 37 can be configured to illustrate the consequences based on a behavior attribute. DVE can be configured to acquire two dimensional and/or three dimensional imagery of an area of interest, thereby creating an easily understood functional canvas which can be subsequently used to present asset data and the results of analyses. Data resolution requirements can vary depending on the nature of the analysis. Imagery types can include charts, diagrams, three dimensional structures, topographical mapping, orthophoto production, planimetric mapping, digital elevation models, and terrain modeling.

Continuing to still further refer to FIG. 2, system 100 can also include asset information management system (AIMS) 45 configured to provide structure, an asset catalog, security, fast access, and flexible and expandable storage. AIMS intelligently manages CI/KR information, asset details, and vulnerabilities and dependencies and their effect on the performance of an asset 53, such as, for example, required inputs, outputs produced, sustainability, sensitivities, consequences of failure, and recovery limitations. Based on this analysis, other assets that impact the function of the critical assets can be identified and added to asset information database 49. For example, input for a diesel generator might include diesel fuel lubricating oil, cooling water, Supervisory Control and Data Acquisition (SCADA) for automatic startup, and human activity for manual startup; output might include exhaust and electricity; and vulnerabilities might include high water level due to flooding and vibration damage due to a seismic event.

Continuing to still further refer to FIG. 2, identification process (IDENT) 11 can be utilized to, for example, (1) identify region 19 of interest and at least one disaster or disruptive event 23, (2) obtain imagery 27 to prepare base canvas 27A and three dimensional data 29A associated with region 19 of interest, (3) identify a plurality of assets 53 required to respond to the at least one disaster or disruptive event 23, and (4) identify asset dependencies 73 and asset vulnerabilities 75. DVE 37 can be configured to, for example, (1) prepare base canvas 27A and the three dimensional data 29A associated with region 19 of interest, (2) superimpose asset data 15 in a manner that it appears to the user, for example by user interface 21, as data layer 31 for each of the asset types 37A, (3) superimpose graphical representations 33 associated with assets 53, (4) create region display 34 including base canvas 27A, the plurality of data layers 31, data feeds 13, graphical representations 33, and control interface tools 94, (5) display region display 34, (6) geospatially align the plurality of data layers 31 and data feeds 13 with base canvas 27A according to location information 43, (7) enable manipulation of region display 34 in order to view selected areas, display assets 53 and associated graphical representations 33 in the selected areas, (8) provide asset dependencies 73, asset vulnerabilities 75, disaster or disruptive event assets 53, sensor data 18, and current asset condition 39B, to analytical tools 77 through asset information feed 65, (9) receive results 83 from analytical tools 77, (10) determine current asset condition 39B based on results 83, and (11) retrieve, aggregate and display asset data 15 from displayed assets 63 using display processor 59.

Continuing to still further refer to FIG. 2, AIMS 45 can be configured to, for example, (1) manage, by, for example, database manager 47, the retrieval and/or storage of asset information 49, and information stored in external databases, (2) store asset data 15, and updated assets 55, (3) store asset information 49, which may include asset data 15, asset location information 43, asset dependencies 73, and asset vulnerabilities 75, (4) receive query 67A of displayed assets 63, (5) retrieve, by, for example, query processor 67, asset information 49 associated with displayed assets 63 based on query 67A, (6) receive results 83 from analytic tools 77, and (7) update asset data 15 forming updated assets 55 based on results 83. ADAS 69 can be configured to, for example, (1) obtain updated assets 55 from asset data updater 71 by comparing query results from query 67A to asset information 49, and (2) obtain information about assets 53 within region 19. AIMS 45 and DVE 37 can be configured to train personnel, test policies and procedures associated with disaster or disruptive event 23, and provide common operating picture 32 for command and control of disaster or disruptive event 23 by using sensor data 18 from sensors 91, simulated input 22, or manually changed conditions 39A to determine current asset condition 39B associated with disaster or disruptive event 23, by feeding displayed assets 63, asset dependencies 73, and asset vulnerabilities 75 to analytical tools 77, and by replacing asset data 15 with updated assets 55 and repeating these steps as disaster or disruptive event 23 evolves, providing results 83 that can be shared, for example, by communications network 79, among multiple displays and used to coordinate and control a response to disaster or disruptive event 23, including deploying and tracking assets based on location information 43 received from location receiver 92.

Continuing to still further refer to FIG. 2, an example of the use of system 100 is an urban setting in which the availability of care during and after flooding in proximity to a hospital is of concern. Factors that could influence the availability of care can include availability of electric power, ability to sustain operation after loss of power, and access to the hospital. After system 100 is executed, during an after action review, it could be found that the simulation indicates that current system architectures do not take into account the consequences of power supply interdependencies. System 100 can be used to identify architecture redesign aspects such as, for example, having portable standby dewatering pumps that could be brought to bear, having an alternative source of power to the pump, hardening the substation to prevent water ingress, increasing fuel storage at the hospital, having a means of fuel delivery that does not require the use of the main access routes, having a second source of power to the hospital, and carrying fuel to the hospital on boats. After the cost/benefit analysis of possible remedial actions is complete, system 100 can be provided with the information as modified by the result of the cost/benefit analysis, and can be used to simulate the flooding event again.

Figure 3A:
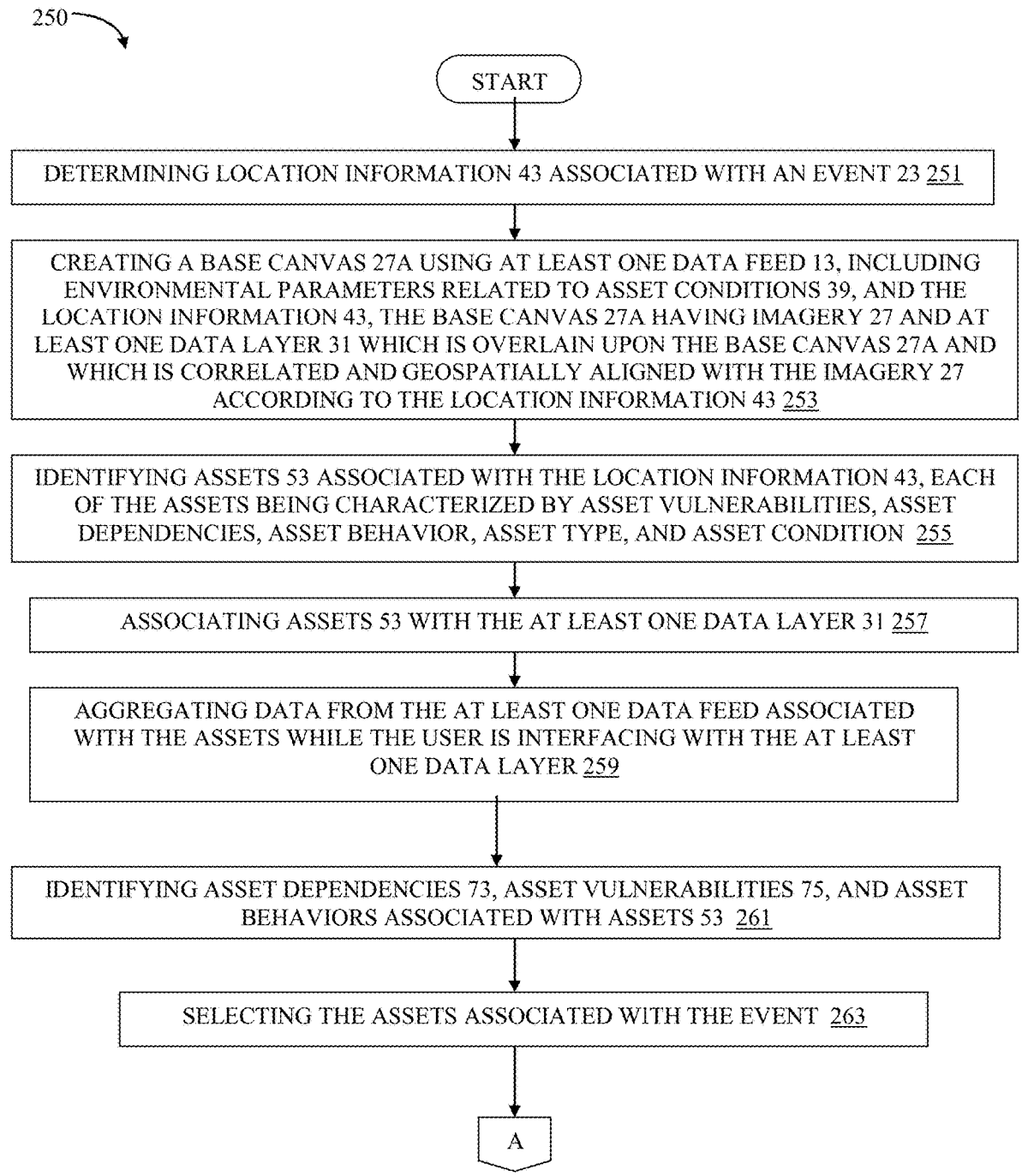
FIGS. 3A-3B are flowcharts of the method of the present embodiment.
Figure 3B:
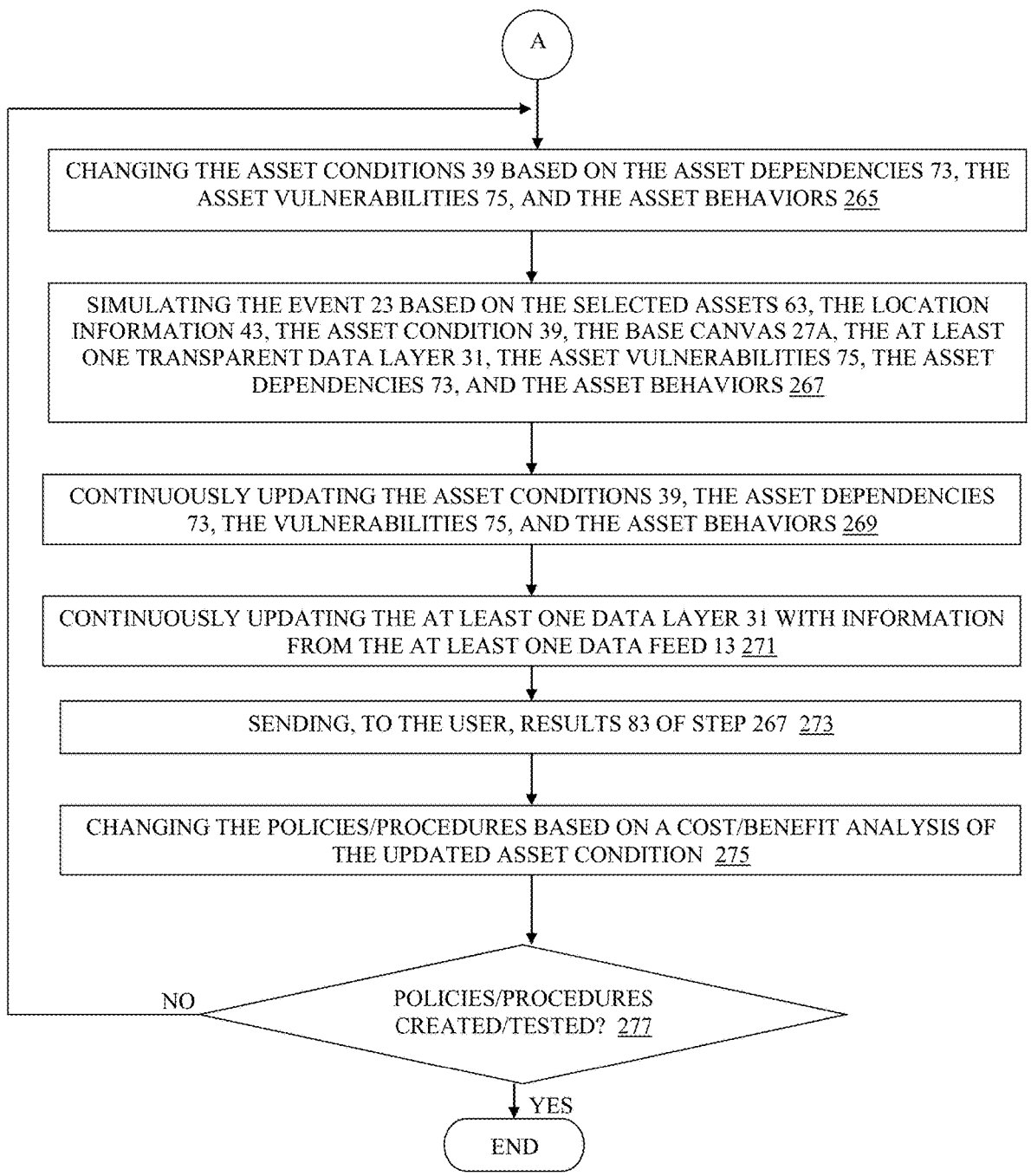

Referring primarily to FIGS. 3A-3B, method 250 for creating and testing procedures/policies to respond to an event 23 can include, but is not limited to including, the steps of (a) determining 251 location information 43 associated with event 23, and (b) creating 253 base canvas 27A using at least one data feed 13, which can include, but is not limited to including, environmental parameters related to asset conditions such as, for example, ambient temperature, and location information 43. Base canvas 27A can include imagery 27 and at least one data layer 31 which can be overlain upon base canvas 27A and which can be correlated and geospatially aligned with imagery 27 according to location information 43. Method 250 can also include the steps of (c) identifying 255 assets 53 associated with location information 43, each of the assets being characterized by asset vulnerabilities, asset dependencies, asset behavior, asset type, and asset condition, (d) associating 257 assets 53 with at least one data layer 31, (e) aggregating 259 data from at least one data feed 13 associated with assets 53 while the user is interfacing with at least one data layer 31, and (f) identifying 261 asset dependencies 73, asset vulnerabilities 75, and asset behaviors associated with assets 53. Method 250 can also include the steps of (g) selecting 263 assets 53 associated with event 23, (h) changing 265 asset condition 39 based on asset dependencies 73, asset vulnerabilities 75, and asset behaviors, and (i) simulating 267 event 23 based on selected assets 54, location information 43, asset condition 39, base canvas 27A, at least one data layer 31, asset vulnerabilities 75, asset dependencies 73, and asset behavior. Method 250 can still further include the steps of (j) continuously updating 269 asset condition 39 based on asset vulnerabilities 75, asset dependencies 73, and asset behaviors, (k) continuously updating 271 at least one data layer 31 with information from the at least one data feed 13, (1) sending 273 results 83 of the step of simulating to the user, (m) changing 275 the policies/procedures based on a cost/benefit analysis of the updated asset condition, and repeating 277 steps (h)-(m) until the policies and procedures are created and tested.

Method 250 can optionally include the steps of recording asset dependencies 73 and asset vulnerabilities 75 on computer-readable medium 26, grouping assets 53 according to asset type 37A, automatically deriving type-specific data from assets 53 based on asset type 37A, and storing the asset-specific or type-specific data on computer-readable medium 26. Method 250 can also optionally include the step of applying visualization and control interface tools 94 so that assets 53 appear to the user to be operating in the at least one data layer 31. Method 250 can still further optionally include the steps of identifying an alternate group of data feeds from data feeds 13, identifying and resolving conflicts among information received from data feeds 13 and the alternate group using predetermined algorithms, identifying specific data feeds from data feeds 13 that contain analytical information, and superimposing the analytical information on at least one data layer 31.

Figure 4A:
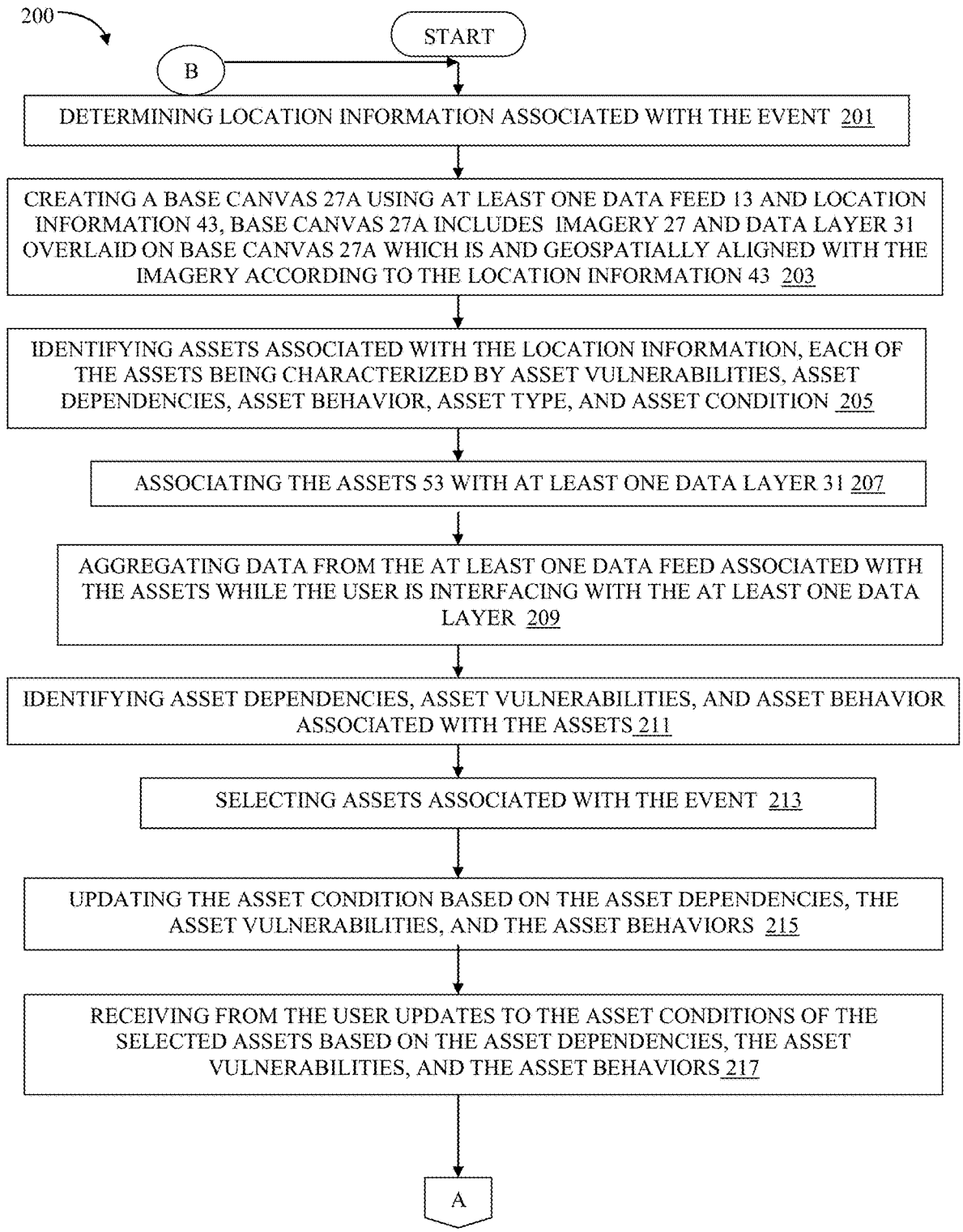
FIGS. 4A-4B are flowcharts of an illustrative method of use of the system of the present embodiment for training and policy development.
Figure 4B:
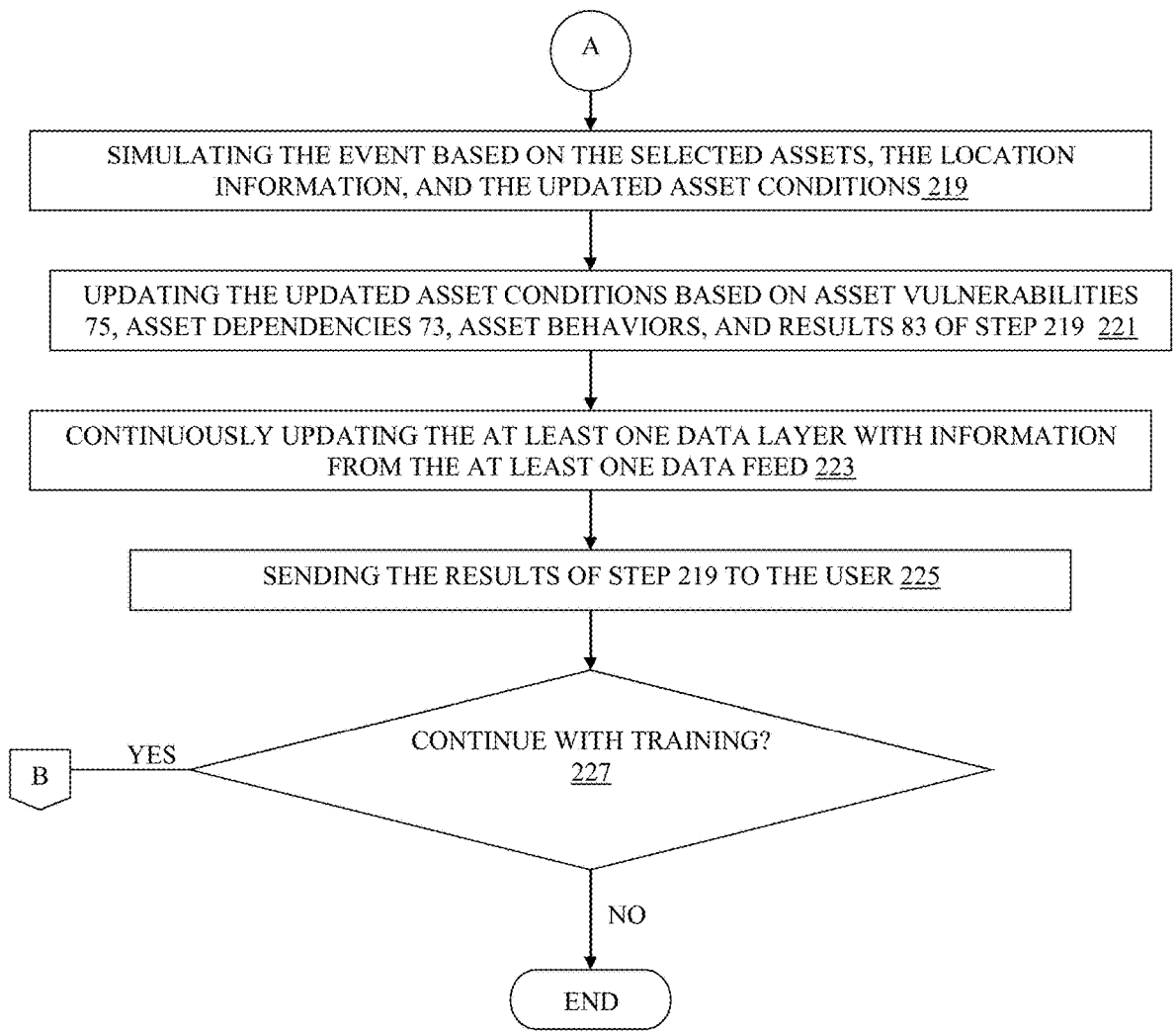

Referring now primarily to FIGS. 4A-4B, method 200 for training personnel to respond to an event 23 can include, but is not limited to including, the steps of (a) determining 201 location information 43 associated with event 23, and (b) creating 203 base canvas 27A using at least one data feed 13 and location information 43. Base canvas 27A can include imagery 27 and at least one data layer 31 overlain upon base canvas 27A which is correlated and geospatially aligned with imagery 27 according to location information 43, (c) identifying 205 assets 53 associated with location information 43, each asset 53 being characterized by asset vulnerabilities 75, asset dependencies 73, asset behavior, asset type 37A, and asset condition 39, (d) associating 207 assets 53 with at least one data layer 31, and (e) aggregating 209 data from at least one data feed 13 associated with the assets 53 while the user is interfacing with at least one data layer 31. Method 200 can also include the steps of (f) identifying 211 asset dependencies 73, asset vulnerabilities 75, and asset behavior associated with assets 53, (g) selecting 213 assets 53 associated with event 23, (h) updating 215 asset condition 39 based on asset dependencies 73, asset vulnerabilities 75, and asset behaviors, (i) receiving 217 from the user updates to asset conditions 39 of selected assets 54 based on asset dependencies 73, asset vulnerabilities 75, and asset behaviors. Method 200 can further include the steps of (j) simulating 219 event 23 based on selected assets 54, location information 43, the updated asset conditions, (k) updating 221 the updated asset conditions based on asset vulnerabilities 75, asset dependencies 73, asset behaviors, and results 83 of step (j), (l) continuously updating 223 at least one data layer 31 with information from at least one data feed 13, (m) sending 225 results 83 of step (j) to the user, and (n) repeating 227 steps (i)-(m) until the training is complete. Method 200 can optionally include the step of feeding asset condition 39, asset dependencies 73, asset vulnerabilities 75, and asset behaviors to analytical tools 77 to create the modified asset conditions.

In an alternate embodiment, an alternate method for aggregating and displaying asset information to create a common operating picture 32 that can be utilized to simulate an event 23 to train personnel and develop and test policies and procedures can include, but is not limited to, the steps of (a) preparing base canvas 27A from imagery 27 and data 29A associated with region 19 of interest associated with event 23, (b) identifying assets 53 required to respond to event 23, (c) identifying asset data 15 related to assets 53; (d) supplementing asset data by conducting automated queries against data feeds 13, (e) receiving location information 43 for assets 53, and (f) correlating and geospatially aligning data layers 31 and data from data feeds 13 with base canvas 27A according to location information 43. The alternate method can also include the steps of (g) providing correlated/aligned data 16, data layers 31, and base canvas 27A to the user, and (h) aggregating correlated/aligned data 16 into region display 34 including base canvas 27A, data layers 31, data from data feeds 13, and graphical representations 33 associated with selected assets 54 from assets 53. The alternate method can still further include the steps of (i) querying selected assets 54 to retrieve supplemented asset data associated with selected assets 54, (j) identifying, from supplemented asset data, asset dependencies 73, asset vulnerabilities 75, and asset behaviors of selected assets 54, and (k) creating common operating picture 32 based on base canvas 27A, data layers 31, data from data feeds 13, asset dependencies 73, asset vulnerabilities 75, and asset behaviors.

The alternate method can optionally include the steps of (l) identifying the region 19 of interest and event 23, (m) receiving and processing imagery 27 associated with region 19, (n) grouping assets 53 according to asset type 37A, (o) displaying each of asset type 37A as one data layer 31, (p) configuring location information 43 of one or more of graphical representations 33 so that location information 43 appears to be located on data layer 31, (q) displaying region display 34, (r) enabling manipulation of region display 34 in order to view selected areas within region display 34, (s) displaying selected assets 54 associated with graphical representations 33 in the selected areas, (t) aggregating and displaying asset data 15 from selected assets 54, and (u) creating common operating picture 32 based on steps (l)-(t).

Figure 5:
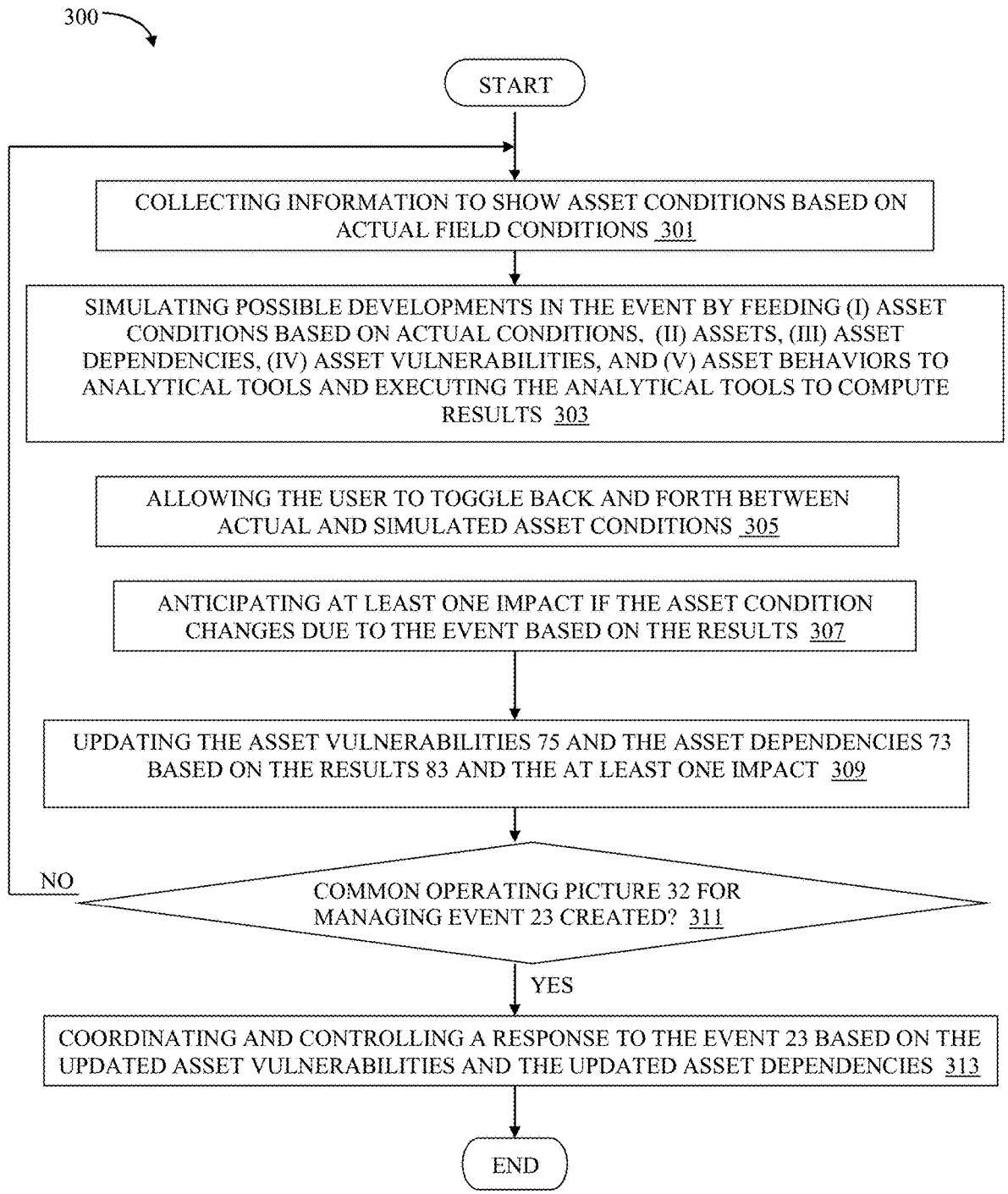
FIG. 5 is a flowchart of the use of the system of the present embodiment for management of an actual event.

Referring now primarily to FIG. 5, method 300 for aggregating and displaying asset information to create common operating picture 32 for coordinating and controlling a response to an event 23 can include, but is not limited to including the steps of (a) collecting 301 information to show asset conditions 39 based on actual field conditions (b) simulating 303 possible developments in event 23 by feeding (ii) asset conditions 39 based on the actual field conditions, (ii) assets 53, (iii) asset dependencies 73, (iv) asset vulnerabilities 75, and (v) asset behaviors to analytical tools 77 and executing analytical tools 77 to compute results 83, (c) allowing 305 the user to toggle back and forth between actual and simulated asset conditions 39, (d) anticipating 307 at least one impact if asset condition 39 changes due to event 23 based on results 83, (e) updating 309 asset vulnerabilities 75 and asset dependencies 73 based on results 83 and the at least one impact, (f) repeating 311 steps (a) through (e) to create common operating picture 32 for managing event 23, and (g) coordinating and controlling 313 a response to event 23 based on the updated asset vulnerabilities and the updated asset dependencies. The step of coordinating and controlling 313 can include the step of deploying and tracking assets 53 based on location information 43 received from location receiver 92 and the response to event 23.

Method 300 can optionally include the steps of identifying region 19 impacted by event 23, displaying region display 34 and asset data 15 including assets 53, assent dependencies 73, and asset vulnerabilities 75, updating asset data 15 to form updated assets 55, and storing updated assets 55 on computer-readable medium 26. Method 300 can also optionally include as the steps of determining, for region 19, imagery 27 and other data 29A, for example, three-dimensional data, for base canvas 27A upon which selected data layers can be overlaid, acquiring imagery 27 and other data 29A to make base canvas 27A geospatially accurate, selecting assets 53 required to respond to event 23, identifying selected assets 54 equipped with global positioning system (GPS) transponders, for each of the selected GPS enabled assets, identifying location receiver 92 that can provide location information 43, and associating each of the selected GPS enabled assets with geospatial information based on location information 43. Method 300 can also optionally include the steps of grouping assets 53 into asset types 37A, associating graphical representation 33 with each asset type 37A, locating graphical representations 33 of the selected GPS enabled assets on base canvas 27A according to the geospatial information, identifying sources of data 29A for each of the selected GPS enabled assets, adding data geospatial information to the data 29A, associating the data 29A with graphical representation 33 according to the data geospatial information and the geospatial information, enabling manipulation of base canvas 27A, and enabling selective display of data layers 31 and assets 53. Method 300 can further optionally include the steps of enabling querying of asset 53 to display the data 29A, aggregating and displaying the data 29A associated with asset 53, updating the data 29A and the geospatial information in real time, resolving conflicts between data layers 31 using automated methods, identifying external data feeds and associating the external data feeds with assets 53, linking external analysis applications to assets 53, identifying asset dependencies 73, asset vulnerabilities 75, and asset behaviors, creating dependency information from asset dependencies 73, storing the dependency information on computer-readable medium 26, and implementing analysis tools 77 associated with data layers 31.

Referring primarily to FIGS. 1, 2, 3A-3B, 4A-4B, and 5, methods 200, 250, and 300 and systems 100 and 150 can be used operationally to prepare for an unexpected event by facilitating the steps of (a) identifying the geographic region of interest, (b) determining what kind of imagery 27 and data 29A would best serve as a base canvas 27A upon which selected data layers 31 can be overlaid (for example, two dimensional low resolution graphics, three dimensional high resolution graphics, maps, charts, etc.), (c) acquiring imagery 27 and data 29A to prepare a geospatially accurate base canvas 27, (d) identifying assets 53 required to accomplish the mission (for example, office buildings, fire stations, and railroads), (e) for each asset type 37A required, identifying location receiver 92 that can provide live information (for example, cameras and GPS locators), (f) creating data layer 31 for each asset type 37A with assets 53 identified by graphical representations 33, the locations of which align correctly with base canvas 27A, and (g) identifying sources of data 29A for each asset 53. The asset data 15 might already exist in geospatial format; for example, there may be a data base with the location of fire stations, and another with emergency equipment that may correspond to the same physical building, or in multiple conventional data bases, for example, building square footage may be contained in municipality tax records. Further steps facilitated by system 100 can include (h) in the case of non-geospatially oriented data, adding geospatial information to the data 29A so it can be referenced by clicking graphical representation 33 in data layer 31, (i) providing the capability to select base canvas 27A and manipulate it, for example, zooming in and out, and rotating) using intuitive hand gestures, (j) displaying multiple data sources in a common environment by allowing the selection of which assets 53 and data layers 31 are displayed, (k) allowing users to query an asset 53 by selecting it and summoning data from displayed and selected but not displayed data layers 31, and external data sources, and (l) aggregating and displaying data 29A concerning asset 53 such as, for example, asset data 15 and asset information 49 from displayed and selected data layers 31. The system can mark and/or highlight assets 53 that have changed according to the date of change and/or asset condition 39 that changed. Still further steps facilitated by system 100 can include (m) conducting an internet search to ascertain if more current asset data 15 is available, (n) using fuzzy logic to resolve conflicts between data layers 31, for example, inconsistent phone numbers, (o) identifying external data feeds providing additional information that is useful in performing analyses such as, for example, weather and traffic conditions, (p) adding external data feeds to a list of data layers 31 accessible to the user, (q) identifying analytical tools 77 that are useful in performing analyses, for example, plume dispersal models and blast damage models, (r) linking external analysis applications so that required inputs are supplied from AIMS 45 and results are fed back to AIMS 45, (s) identifying asset dependencies 73 and asset vulnerabilities 75 for example, services required for operation such as electricity and water, and conditions that prevent operation such as, for example, a flood above eight inches or wind speed greater than fifty mph, (t) recording model-specific dependency/vulnerability data and storing dependency information for future use, and (u) implementing analysis tools 77 as data layers 31 that utilize and interact with AIMS 45, for example, creating interdependency models and performing simulations.

Referring primarily to FIGS. 3A-3B, 4A-4B and 5, methods 250 (FIGS. 3A-3B), 200 (FIGS. 4A-4B), and 300 (FIG. 5) of the present embodiment can be, in whole or in part, implemented electronically. Signals representing actions taken by elements of systems 150 (FIG. 1) and 100 (FIG. 2) can travel over electronic communications network 79 (FIG. 1). Control and data information can be electronically executed and stored on computer-readable media 26 (FIG. 2). Systems 150 (FIG. 1) and 100 (FIG. 2) can be implemented to execute on a node such as server 28 (FIG. 2) in communications network 79. Common forms of computer-readable media 26 can include, but are not limited to, for example, a floppy disk, a flexible disk, a hard disk, magnetic tape, or any other magnetic medium, a CDROM or any other optical medium, punched cards, paper tape, or any other physical medium with patterns of holes or ink or characters, a RAM, a PROM, and EPROM, a FLASH-EPROM, or any other memory chip or cartridge, a carrier wave, or any other medium from which a computer can read.

Although various embodiments are described herein, it should be realized that a wide variety of further and other embodiments can be realized with the disclosed technology.

What is claimed is:
1. A computer implemented method for training personnel to respond to an event comprising:
   (a) determining location information associated with the event;
   (b) creating a base canvas using at least one data feed and the location information,
   wherein the base canvas includes imagery and at least one data layer which is overlain upon the base canvas and which is correlated and geospatially aligned with the imagery according to the location information;
   (c) identifying assets associated with the location information, each of the assets being characterized by asset vulnerabilities, asset dependencies, asset behavior, asset type, and asset condition;
   (d) associating the assets with at least one data layer;
   (e) aggregating data from the at least one data feed associated with the assets while a user is interfacing with the at least one data layer;
   (f) identifying asset dependencies, asset vulnerabilities, and asset behavior associated with the assets;
   (g) selecting assets associated with the event;

(h) updating the asset condition based on the asset dependencies, the asset vulnerabilities, and the asset behaviors;

(i) receiving, from the user, updates to the asset conditions of the selected assets based on the asset dependencies, the asset vulnerabilities, and the asset behaviors;

(j) determining changes in the updated asset conditions of the selected assets as a result of the event at an instance in event evolution based upon the location information, at least one data layer, the updated asset conditions, the asset dependencies, the asset vulnerabilities and the asset behaviors, thereby performing an event-driven simulation;

(k) updating the updated asset conditions based on the asset vulnerabilities, the asset dependencies, the asset behaviors, and results of step (i);

(l) updating the at least one data layer with information from the at least one data feed;

(m) sending the results of steps (j), (k) and (l) to the user; and (n) evolving the event to a next predetermined instance, and repeating steps (i)-(m) until the event has concluded or the training is complete.

2. A computer implemented system for training personnel to respond to an event comprising:

an information collector determining location information and assets associated with the event;

a base canvas processor creating a base canvas using at least one data feed, said location information, and information associated with said assets, wherein said base canvas includes imagery based on location information and at least one data layer which is overlain upon said base canvas, said base canvas processor continuously updating said at least one data layer with information from said at least one data feed;

a geospatial processor correlating and geospatially aligning said at least one data layer with said imagery and said base canvas according to said location information;

an asset/data layer associater identifying said assets associated with said location information and associating said assets with said at least one data layer;

a user interface receiving selected of said assets from a user who is interfacing with said at least one data layer provided by said base canvas processor while said base canvas processor aggregates data from said at least one data feed associated with said assets;

an asset data processor updating asset condition based on asset dependencies and asset vulnerabilities associated with said selected assets; and a simulator configured to (a) determine change in asset conditions of the selected assets as a result of the event at a predetermined instance in event evolution based upon the location information, the at least one data layer, the updated asset conditions, the asset dependencies, the asset vulnerabilities and the asset behaviors, (b) update asset conditions based on the asset vulnerabilities, the asset dependencies, asset behaviors, and the change in asset condition, and (c) evolve the event to a next predetermined instance, and repeat steps (a)-(b) until the event has concluded or the training is complete; thereby performing an event driven simulation; the simulator simulating the effect of the event based on said selected assets, said location information, said asset condition, said base canvas, said at least one data layer, said asset vulnerabilities, said asset dependencies, and said asset behaviors; the simulator interacting with one or more processors; the simulator using an interdependency network defined by asset dependencies.

3. The system as in claim 2 further comprising:

an information manager grouping said assets according to an asset type, automatically deriving dependency, vulnerability, and behavior information from said assets based on said asset type, and storing said dependency, vulnerability, and behavior information on a computer-readable medium.

4. The system as in claim 2 further comprising:

a conflict resolver identifying and resolving conflicts among information received from a plurality of said at least one data feed, each of said at least one data feed containing analysis information, wherein said base canvas processor superimposes the resolved data feeds on said at least one data layer.

5. The system as in claim 2 further comprising:

an impact analyzer anticipating at least one impact based on said asset condition, said asset dependencies, said asset vulnerabilities, and said asset behaviors, updating said asset condition according to an effect of said at least one impact on said selected assets, and providing a notification to the user by flagging the assets with changed data or changed of the asset conditions.

* * * * *